United States Patent [19]

Mine et al.

[11] Patent Number: 6,094,387
[45] Date of Patent: Jul. 25, 2000

[54] ROLL CALL TESTER

[75] Inventors: Kouji Mine; Yasuji Koshikawa; Tomoko Nobutoki, all of Tokyo, Japan

[73] Assignee: NEC Corporation, Tokyo, Japan

[21] Appl. No.: 09/325,041

[22] Filed: Jun. 3, 1999

[30] Foreign Application Priority Data

Jun. 4, 1998 [JP] Japan .................................. 10-156407

[51] Int. Cl.$^7$ ...................................................... G11C 7/00
[52] U.S. Cl. .......................................... 365/201; 365/200
[58] Field of Search .................................. 365/201, 200, 365/205, 208, 189.05, 225.7

[56] References Cited

U.S. PATENT DOCUMENTS 5,517,458  5/1996  Koshikawa .......................... 365/230.06
5,892,718  4/1999  Yamada .................................. 365/200

*Primary Examiner*—Son Mai
*Attorney, Agent, or Firm*—Sughrue, Mion, Zinn, Macpeak & Seas, PLLC

[57] ABSTRACT

In a roll call tester, a redundancy circuit is provided which, upon predetermined normal cell addressing, activates the normal cell while rendering the redundancy cell nonactive, and, upon predetermined redundancy cell addressing, renders the normal cell nonactive while, when the roll call test signal in the test signal activation circuit is nonactive, activating the redundancy cell. This construction can realize a roll call test while eliminating the need to use a redundancy detection circuit and a signal involved in the detection thereof, and can reduce chip area.

8 Claims, 8 Drawing Sheets

ROLLC : ROLL CALL TEST SIGNAL
DAMP : DATA AMPLIFIER ACTIVATION SIGNAL
REDTST : REDUNDANCY DETECTION CIRCUIT ACTIVATION SIGNAL
ADDRESS : ADDRESS SIGNAL
REDUN : REDUNDANCY CELL SELECTION SIGNAL
NOSEL : NORMAL CELL NON-SELECTION SIGNAL
REDRLT : REDUNDANCY JUDGEMENT RESULT OUTPUT SIGNAL
DATABUS : DATA BUS
DQ : DQ PIN OUTPUT

ROLLC : ROLL CALL TEST SIGNAL
DAMP : DATA AMPLIFIER ACTIVATION SIGNAL
ADDRESS : ADDRESS SIGNAL
REDUN : REDUNDANCY CELL SELECTION SIGNAL
NOSEL : NORMAL CELL NON-SELECTION SIGNAL
DATABUS : DATA BUS
DQ : DQ PIN OUTPUT

ROLL CALL TESTER

FIELD OF THE INVENTION

The invention relates to a roll call tester for a judgment on whether or not a redundancy circuit is in use.

BACKGROUND OF THE INVENTION

A conventional roll call tester, for example, comprises: a normal cell; a redundancy cell that, together with the normal cell, constitutes a memory cell; and a data amplifier connected to the normal cell and the redundancy cell. The data amplifier receives from the normal cell and the redundancy cell data through a bit line or an I/O line, amplifies the data, and outputs the amplified data to a data bus. A data output circuit is connected to the data amplifier. The data output circuit receives data on the data bus, and outputs the data to a DQ (data input/output) pin. A test signal activation circuit is provided for inputting a roll call test signal into a data amplifier activation circuit. The data amplifier activation circuit outputs the data amplifier activation signal, upon receipt of the test signal, to the data amplifier, and outputs a redundancy detection circuit activation signal to a redundancy detection circuit. A predetermined test signal activation address signal is input into the test signal activation circuit.

The roll call tester further comprises a redundancy circuit comprising FUSEROM (a replacement address setting circuit having a group of fuses). A predetermined address signal is input into FUSEROM. A redundancy selection signal and a normal cell non-selection signal are output from the redundancy circuit. The redundancy selection signal is input into the redundancy cell and a redundancy detection circuit, and the normal cell non-selection signal is input into the normal cell. The redundancy detection circuit outputs a judgment result output signal to the data bus.

The operation of the conventional roll call tester will be explained. Under normal condition other than the roll call test, a predetermined test signal activation address signal is nonactive, so that the test signal activation circuit is nonactive, and a roll call test signal ROLLC is also nonactive. Therefore, the data amplifier activation circuit activates a data amplifier activation signal DAMP to activate the data amplifier, while a redundancy detection circuit activation signal REDTST is rendered nonactive to render the redundancy detection circuit nonactive. When the redundancy circuit has not been activated by predetermined addressing, the redundancy selection signal REDUN and the normal cell non-selection signal NOSEL output from the redundancy circuit are nonactive, so that data from the normal cell is transmitted to the data amplifier through the I/O line. The data amplifier outputs the data to the data bus, and the data is then transmitted to the DQ pin.

On the other hand, when the redundancy circuit is activated upon predetermined addressing, the redundancy selection signal REDUN and the normal cell non-selection signal NOSEL are activated. The data from the redundancy cell is transmitted to the data amplifier through the I/O line, is output from the data amplifier to the data bus, and is then output to the DQ pin. The redundancy selection signal REDUN is also input into the redundancy detection circuit. Since, however, the redundancy detection circuit is nonactive, the judgement result output signal REDRLT is nonactive.

Next, at the time of the roll call test, the test signal activation address signal is activated, the test signal activation circuit is activated, and the roll call test signal ROLLC is activated. Upon activation of the roll call test signal ROLLC, the data amplifier activation circuit renders the data amplifier activation signal DAMP nonactive to render the data amplifier nonactive, activates the redundancy detection circuit activation signal REDTST, and activates the redundancy detection circuit. Data from the normal cell and the redundancy cell is transmitted to the data amplifier through the I/O line. Since the data amplifier is nonactive, the data in the memory cell is not output from the data amplifier to the data bus.

When the redundancy circuit is rendered nonactive upon predetermined addressing, the redundancy selection signal REDUN and the normal cell non-selection signal NOSEL output from the redundancy circuit are nonactive, so that the redundancy detection circuit, which receives the redundancy selection signal REDUN, renders the judgement result output signal REDRLT nonactive. The judgement result output signal REDRLT is connected to the data bus, and the data in the data bus is input into the data output circuit and is output to the DQ pin.

When the redundancy circuit is activated upon predetermined addressing, the redundancy selection signal REDUN and the normal cell non-selection signal NOSEL output from the redundancy circuit are activated and respectively input into the redundancy cell and the normal cell. Since, however, the data amplifier is nonactive, the data in the memory cell is not output to the data bus. Upon receipt of the redundancy selection signal REDUN, the redundancy detection circuit activates the judgement result output signal REDRLT which is then output to the data bus. The data output circuit receives the data in the data bus and outputs the data to the DQ pin. Reference to the results output to the DQ pin permits judgement on whether or not the redundancy to be in use. To this end, presetting on the circuit should be made so that "high data" is output when the redundancy is in use, while "low data" is output when the redundancy is not in use.

The conventional roll call tester, however, requires use of a redundancy detection circuit which, upon receipt of a redundancy selection signal REDUN from a redundancy circuit, detects whether or not the redundancy is in use. A signal is also required for outputting the detection results and the like. The additional provision of the circuit and the signal line pose a problem of increased chip area.

SUMMARY OF THE INVENTION

The present invention solves the above problem of the prior art, and it is an object of the present invention to provide a roll call tester which eliminates the need to use a redundancy detection circuit and a signal for outputting the detection results, and can realize a roll call test through the addition, to a redundancy circuit, of logic which permits a roll call test signal to render the redundancy selection signal nonselective even when the redundancy circuit is active, and, in the integration of the circuit, can reduce chip area as a semiconductor chip.

According to the first feature of the invention, a roll call ester comprises:

a data amplifier for amplifying data of a normal cell or a redundancy cell upon activation of the normal cell or the redundancy cell, and outputting the amplified data to a data output circuit, a data amplifier activation circuit for outputting a data amplifier activation signal to the data amplifier independently of whether or not a roll call test is in operation;

a test signal activation circuit for outputting an active roll call test signal at the time of the roll call test; and a redundancy circuit which, when the roll call test signal in the test signal activation circuit is nonactive, upon predetermined normal cell addressing, activates the normal cell while rendering the redundancy cell nonactive, and, upon predetermined redundancy cell addressing, renders the normal cell nonactive while activating the redundancy cell, while said redundancy circuit, when the roll call test signal in the test signal activation circuit is active, upon predetermined normal cell addressing, activates the normal cell while rendering the redundancy cell nonactive, and, upon predetermined redundancy cell addressing, renders both the normal cell and the redundancy cell nonactive.

In the roll call tester, the redundancy circuit preferably comprises a first logic gate which receives a predetermined redundancy cell address signal, and a nonactive roll call test signal from the test signal activation circuit, and outputs a redundancy selection signal.

According to the second feature of the invention, a roll call tester comprises:

a data amplifier for amplifying data of a normal cell or a redundancy cell upon activation of the normal cell or the redundancy cell, and outputting the amplified data to a data output circuit;

a test signal activation circuit for outputting an active roll call test signal at the time of the roll call test;

a second logic gate which, when the roll call test signal of the test signal activation circuit is nonactive, activates the data amplifier through the data amplifier activation circuit; and a redundancy circuit which, when the roll call test signal in the test signal activation circuit is nonactive, activates the data amplifier through the second logic gate and, upon predetermined normal cell addressing, activates the normal cell while rendering the redundancy cell nonactive, and, upon predetermined redundancy cell addressing, renders the normal cell nonactive while activating the redundancy cell, while said redundancy circuit, when the roll call test signal in the test signal activation circuit is active, upon predetermined normal cell addressing, activates the normal cell and renders the redundancy cell nonactive, and activates the data amplifier through the second logic gate, and, upon predetermined redundancy cell addressing, renders both the normal cell and the redundancy cell nonactive and renders the data amplifier nonactive through the second logic gate.

In the roll call tester, the second logic gate is preferably a NAND gate.

In the roll call tester, preferably, upon malfunction of the data amplifier, whether or not the redundancy is in use is judged in such a manner that any data is previously held in the normal cell and the redundancy cell and a memory tester is used to judge that, upon read of the date, an expected value is output from the normal cell not replaced with the redundancy cell while an expected value is not output from the redundancy cell.

BRIEF DESCRIPTION OF THE DRAWINGS

The invention will be explained in more detail in conjunction with the appended drawings, wherein.

DESCRIPTION OF THE PREFERRED EMBODIMENTS

Before describing the roll call tester according to preferred embodiments of the invention, the conventional roll call tester will be explained in conjunction with FIGS. 1 and 2.

Figure 1:
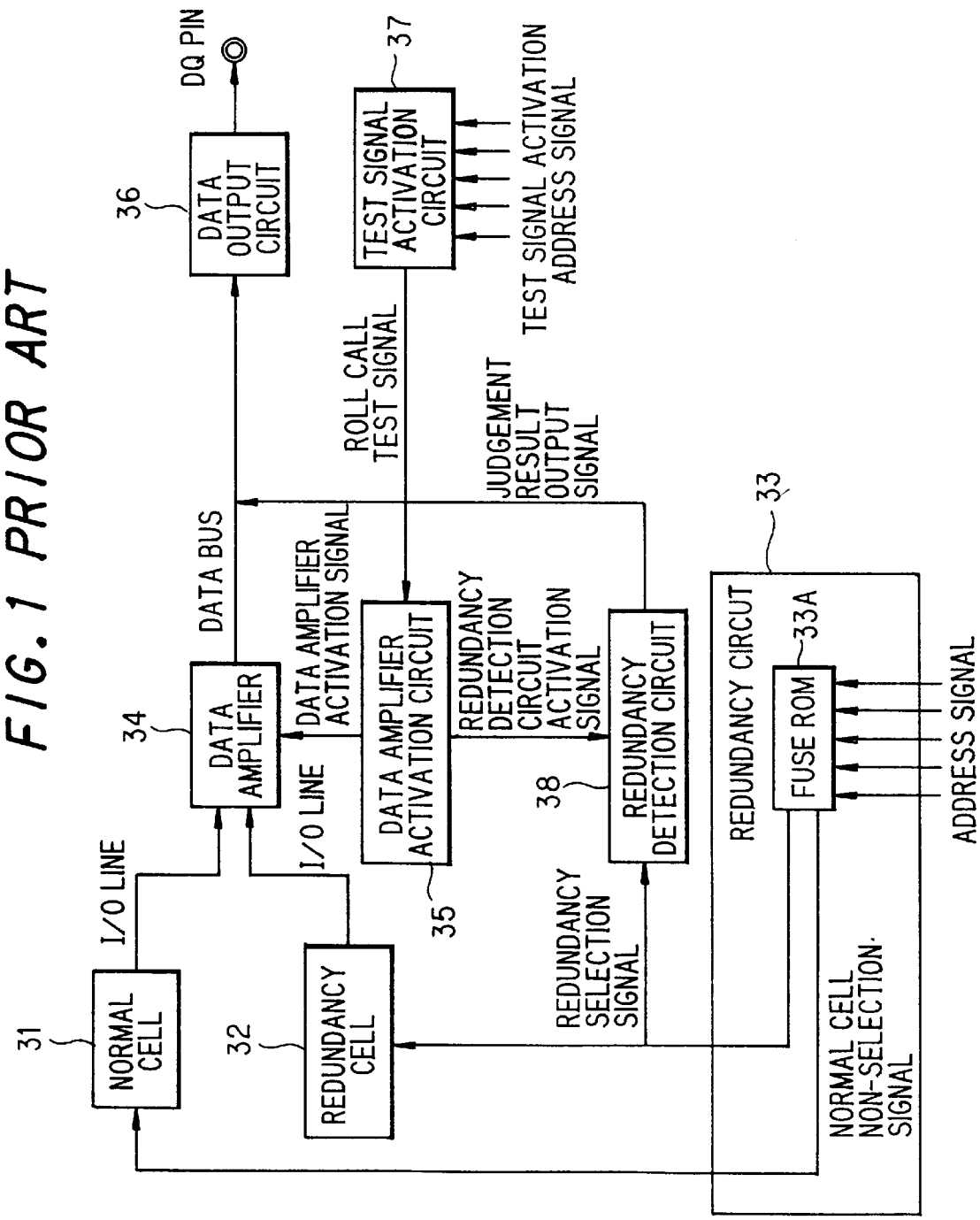
FIG. 1 is a block diagram showing a conventional roll call tester.

FIG. 1 shows an example of the conventional roll call tester. In FIG. 1, numeral 31 designates a normal cell, and numeral 32 a redundancy cell that, together with the normal cell 31, constitutes a memory cell. A data amplifier 34 is connected to the normal cell 31 and the redundancy cell 32. The data amplifier 34 receives from the normal cell 31 and the redundancy cell 32 data through a bit line or an I/O line, amplifies the data, and outputs the amplified data to a data bus. A data output circuit 36 is connected to the data amplifier 34. The data output circuit 36 receives data on the data bus, and outputs the data to a DQ (data input/output) pin. A test signal activation circuit 37 is provided for inputting a roll call test signal into a data amplifier activation circuit 35. The data amplifier activation circuit 35, upon receipt of the test signal, outputs the data amplifier activation signal to the data amplifier 34, and outputs a redundancy detection circuit activation signal to a redundancy detection circuit 38. A predetermined test signal activation address signal is input into the test signal activation circuit 37.

Numeral 33 designates a redundancy circuit comprising FUSEROM (a replacement address setting circuit having a group of fuses) 33A. A predetermined address signal is input into FUSEROM 33A. A redundancy selection signal and a normal cell non-selection signal are output from the redundancy circuit 33. The redundancy selection signal is input into the redundancy cell 32 and a redundancy detection circuit 38, and the normal cell non-selection signal is input into the normal cell 31. The redundancy detection circuit 38 outputs a judgment result output signal to the data bus.

Figure 2:
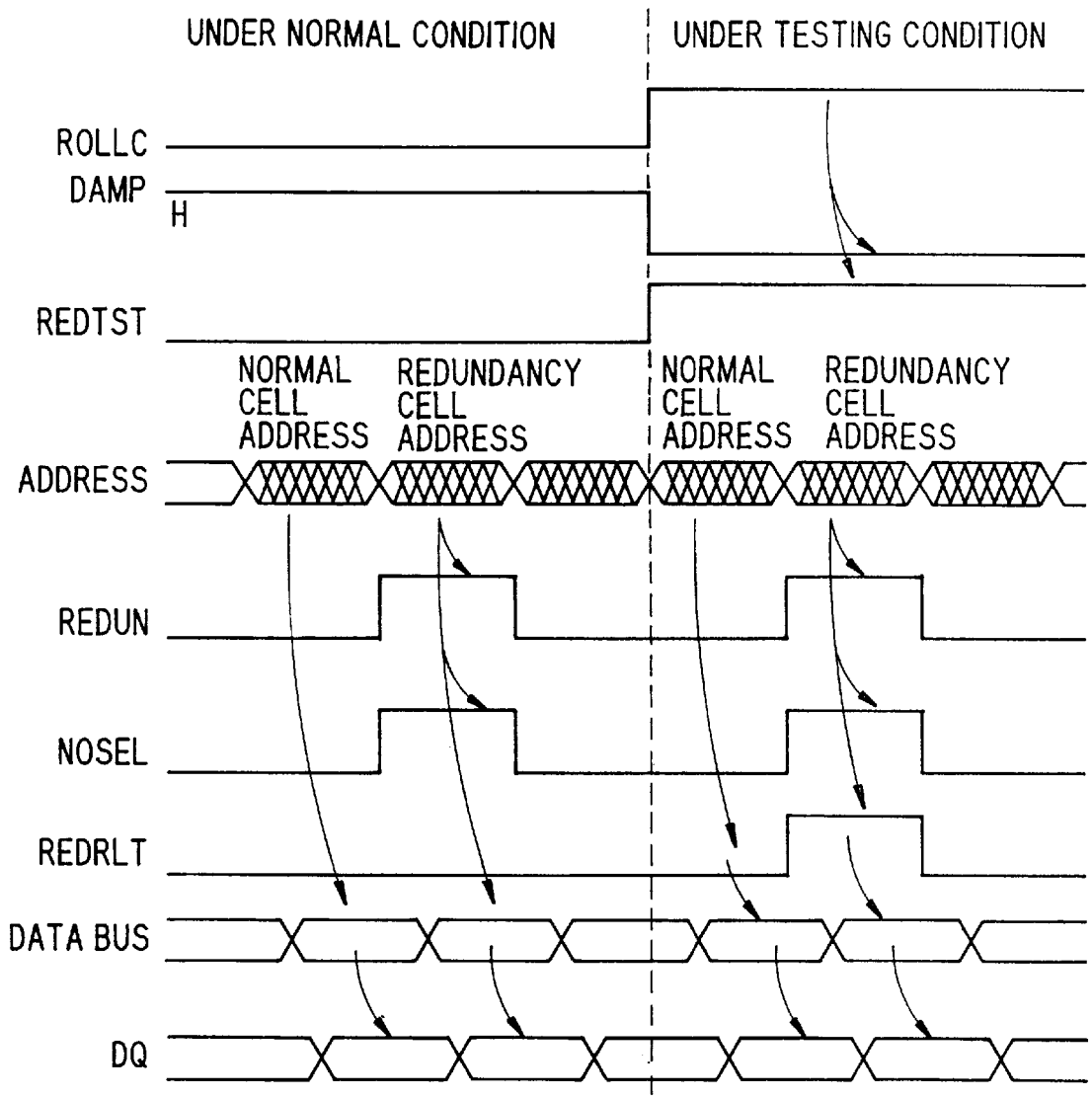
FIG. 2 is a timing chart showing data in each block shown in FIG. 1.

FIG. 2 is a timing chart of data in each block shown in FIG. 1. The operation of the conventional roll call tester will be explained with reference to FIG. 2. Under normal condition other than the roll call test, a predetermined test signal activation address signal is nonactive, so that the test signal activation circuit 37 is nonactive, and a roll call test signal ROLLC is also nonactive. Therefore, the data amplifier activation circuit 35 activates a data amplifier activation signal DAMP to activate the data amplifier 34, while a redundancy detection circuit activation signal REDTST is rendered nonactive to render the redundancy detection circuit 38 nonactive. When the redundancy circuit 33 has not been activated by predetermined addressing, the redundancy selection signal REDUN and the normal cell non-selection signal NOSEL output from the redundancy circuit 33 are nonactive, so that data from the normal cell 31 is transmitted to the data amplifier 34 through the I/O line. The data amplifier 34 outputs the data to the data bus, and the data is then transmitted to the DQ pin.

On the other hand, when the redundancy circuit 33 is activated upon predetermined addressing, the redundancy selection signal REDUN and the normal cell non-selection signal NOSEL are activated. The data from the redundancy cell 32 is transmitted to the data amplifier 34 through the I/O line, is output from the data amplifier 34 to the data bus, and is then output to the DQ pin. The redundancy selection signal REDUN is also input into the redundancy detection circuit 38. Since, however, the redundancy detection circuit 38 is nonactive, the judgement result output signal REDRLT is nonactive.

Next, at the time of the roll call test, the test signal activation address signal is activated, the test signal activation circuit 37 is activated, and the roll call test signal ROLLC is activated. Upon activation of the roll call test signal ROLLC, the data amplifier activation circuit 35 renders the data amplifier activation signal DAMP nonactive to render the data amplifier 34 nonactive, activates the redundancy detection circuit activation signal REDTST, and activates the redundancy detection circuit 38. Data from the normal cell 31 and the redundancy cell 32 is transmitted to the data amplifier 34 through the I/O line. Since the data amplifier 34 is nonactive, the data in the memory cell is not output from the data amplifier 34 to the data bus.

When the redundancy circuit 33 is rendered nonactive upon predetermined addressing, the redundancy selection signal REDUN and the normal cell non-selection signal NOSEL output from the redundancy circuit 33 are nonactive, so that the redundancy detection circuit 38, which receives the redundancy selection signal REDUN, renders the judgement result output signal REDRLT nonactive. The judgement result output signal REDRLT is connected to the data bus, and the data in the data bus is input into the data output circuit 36 and is output to the DQ pin.

When the redundancy circuit 33 is activated upon predetermined addressing, the redundancy selection signal REDUN and the normal cell non-selection signal NOSEL output from the redundancy circuit 33 are activated and respectively input into the redundancy cell 32 and the normal cell 31. Since, however, the data amplifier 34 is nonactive, the data in the memory cell is not output to the data bus. Upon receipt of the redundancy selection signal REDUN, the redundancy detection circuit 38 activates the judgement result output signal REDRLT which is then output to the data bus. The data output circuit 36 receives the data in the data bus and outputs the data to the DQ pin. Reference to the results output to the DQ pin permits judgement on whether or not the redundancy to be in use. To this end, presetting on the circuit should be made so that "high data" is output when the redundancy is in use, while "low data" is output when the redundancy is not in use.

The conventional roll call tester, however, requires use of a redundancy detection circuit which, upon receipt of a redundancy selection signal REDUN from a redundancy circuit 33, detects whether or not the redundancy is in use. A signal is also required for outputting the detection results and the like. The additional provision of the circuit and the signal line poses a problem of increased chip area.

Next, roll call testers according to the preferred embodiments of the invention will be explained in conjunction with FIGS. 3 to 8.

Figure 3:
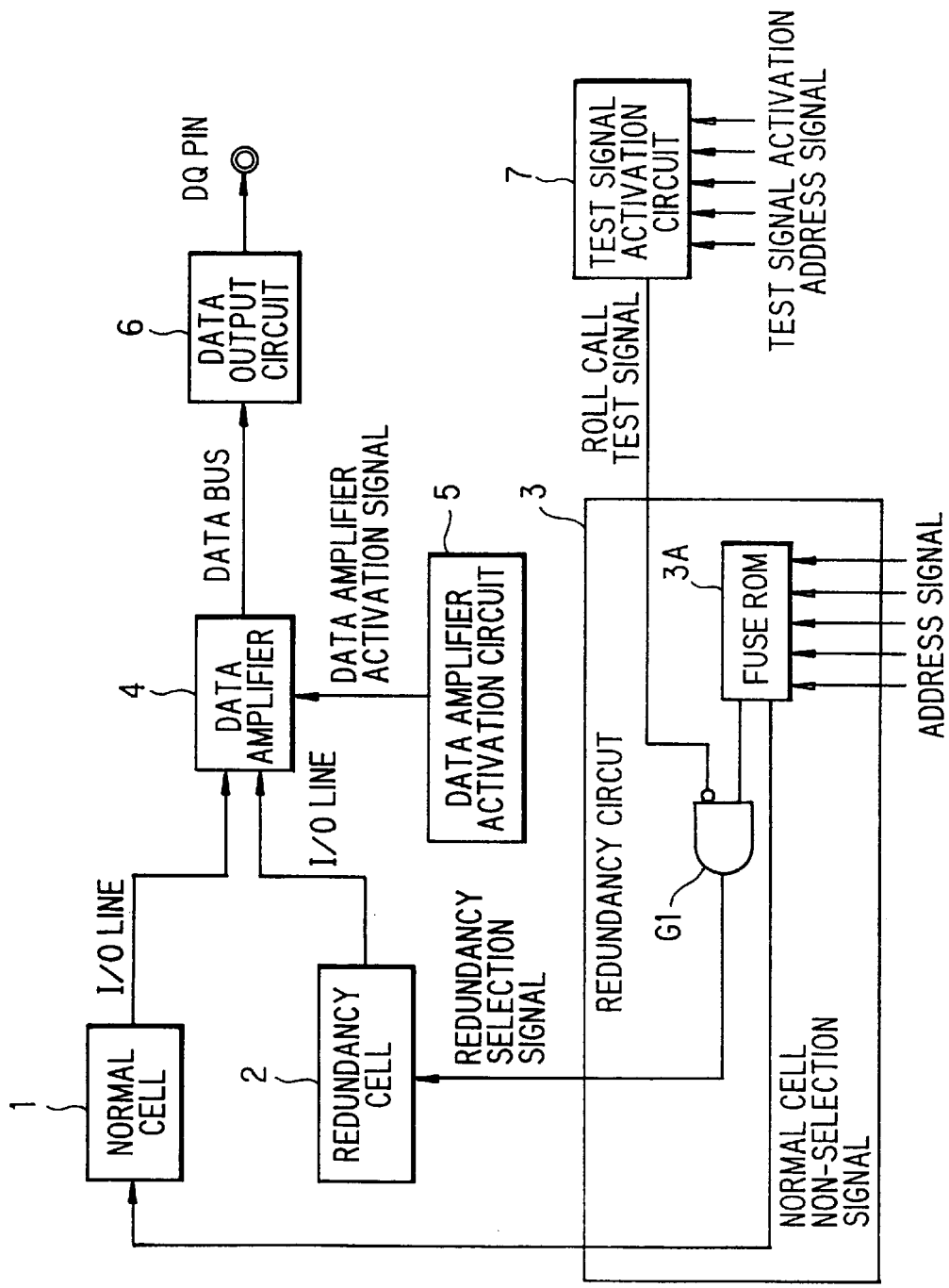
FIG. 3 is a block diagram showing a roll call tester according to a preferred embodiment of the invention.

FIG. 3 shows a roll call tester according to a first preferred embodiment of the invention. In FIG. 3, numeral 1 designates a normal cell, and numeral 2 a redundancy cell. The normal cell 1 and the redundancy cell 2 are connected to a data amplifier 4 which receives data through a bit line or an I/O line, amplifies the data, and outputs the amplified data to a data bus. The normal cell 1 and the redundancy cell 2 comprise a row decoder, a column decoder, a sense amplifier, a word line, a bit line, a transfer gate for controlling data transmission from the bit line to the I/O line, and a column switch for controlling the transfer gate. The redundancy circuit 3 comprises FUSEROM 3A. The redundancy circuit 3, upon input of a predetermined address signal into FUSEROM 3A, outputs a normal cell non-selection signal and a redundancy selection signal which are then input into the normal cell 1 and the redundancy cell 2, respectively. A roll call test signal from a test signal activation circuit 7, together with the signal from FUSEROM 3A, is input into a logic gate G1 as a first logic gate for outputting the redundancy selection signal. A predetermined test signal activation address signal is input into the test signal activation circuit 7. The data amplifier 4 amplifies data from the normal cell 1 and the redundancy cell 2 as a memory cell and outputs the amplified data to a data bus. A data output circuit 6 receives data on the data bus and outputs the data to a DQ pin. A data amplifier activation circuit 5 outputs a data amplifier activation signal to the data amplifier 4.

Figure 4:
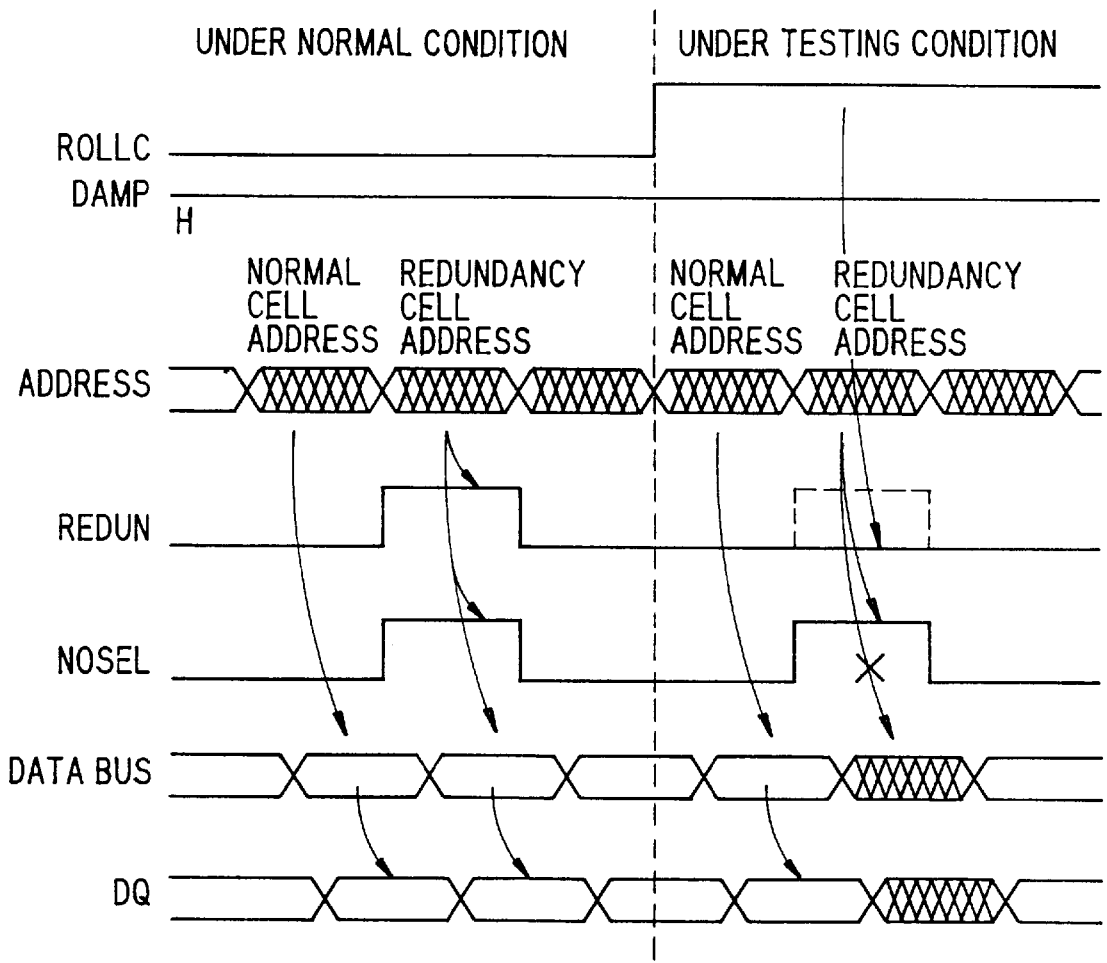
FIG. 4 is a timing chart showing data in each block shown in FIG. 3.

Next, the operation of the roll call tester shown in FIG. 3 will be explained with reference to FIG. 4 which shows a timing chart under normal condition (other than the roll call testing condition) and under roll call testing condition. Under the normal condition and under the roll call test condition, the data amplifier activation circuit 5 activates a data amplifier activation signal DAMP to activate the data amplifier 4. Under the normal condition, a predetermined test signal activation address signal input into the test signal activation circuit 7 is nonactive. Therefore, the test signal activation circuit 7 is nonactive, and the roll call test signal ROLLC is nonactive.

Upon generation of a predetermined normal cell address signal (hereinafter often referred to as "predetermined normal cell addressing"), that is, when the normal cell 1 is not replaced with the redundancy cell 2, the redundancy cell 2 is nonactive and the redundancy selection signal REDUN and normal cell non-selection signal NOSEL output from the redundancy circuit 3 are nonactive. Therefore, the data from the normal cell 1 is transmitted through the bit line or I/O line to the data amplifier 4, and is output from the data amplifier 4 to the data bus. The data output circuit 6 upon receipt of the data on the data bus outputs the data to the DQ pin.

On the other hand, upon selection of the redundancy cell address by predetermined addressing (hereinafter often referred to as "generation of a predetermined address signal), that is, when the normal cell 1 is replaced with the redundancy cell 2 upon predetermined addressing, the redundancy circuit 3 is activated to output, from FUSEROM 3A, a signal for selecting the redundancy cell which is then input into a logic gate G1 in the next stage. Since the roll call test signal ROLLC input into the logic gate G1 is inactive, the redundancy selection signal REDUN input from the redundancy circuit 3 into the redundancy cell 2 is activated. At that time, the normal cell non-selection signal NOSEL input into the normal cell 1 is also activated.

Thus, upon activation of the redundancy selection signal REDUN and the normal cell non-selection signal NOSEL, data from the normal cell 1 is not transmitted to the I/O line, and the data is transmitted from the redundancy cell 2 through the I/O line to the data amplifier 4. The data is then output from the data amplifier 4 to the data bus, and is input into the data output circuit 6 which outputs the data to the DQ pin. The normal cell 1 and the redundancy cell 2 are controlled in this way, and the data from the normal cell 1 and the redundancy cell 2 is transmitted to the I/O line, and is input into the data amplifier 4 which outputs the data to the data bus. The data output circuit 6 receives the data from the data bus and outputs the data to the DQ pin.

On the other hand, at the time of the roll call test, a predetermined test signal activation address signal input into the test signal activation circuit 7 is activated to activate the test signal activation circuit 7, and the roll call test signal ROLLC is activated. Upon selection of the normal cell address by predetermined addressing, that is, when the normal cell 1 is not replaced with the redundancy cell 2, the redundancy circuit 3 is nonactive and the redundancy selection signal REDUN and the normal cell non-selection signal NOSEL output from the redundancy circuit 3 are rendered nonactive. In this case, as with the normal condition, the data from the normal cell 1 is transmitted through the I/O line to the data amplifier 4, and is output from the data amplifier 4 to the data bus. Upon receipt of the data from the data bus, the data output circuit 6 outputs the data to the DQ pin.

Upon selection of the redundancy cell address by predetermined addressing, that is, when the normal cell 1 is replaced with the redundancy cell 2 by predetermined addressing, the redundancy circuit 3 is activated to output, from FUSEROM 3A, a signal for selecting the redundancy cell which is then input into a logic gate G1 in the next stage. Since the roll call test signal ROLLC input into the logic gate G1 is active, the redundancy selection signal REDUN output from the logic gate G1 is rendered nonactive, so that the redundancy cell 2 is not selected. Therefore, data from the redundancy cell 2 is not transmitted to the I/O line.

Further, in this case, since the normal cell non-selection signal NOSEL output from the redundancy circuit 3 is active, the normal cell 1 also is not selected. Therefore, the data from the normal cell 1 also is not transmitted to the I/O line. As a result, from neither the normal cell 1 nor the redundancy cell 2, data is transmitted to the I/O line which, therefore, does not transmit data to the data amplifier 4, so that the data amplifier 4 does not transmit any data to the data bus. Therefore, the data output circuit 6 also does not output any established data to the DQ pin.

In this case, however, if malfunction has occurred in the data amplifier 4 attributable to the I/O line free from data, some data is output from the data amplifier 4 to the data bus which transmits the data to the data output circuit 6, followed by output of the data from the data output circuit 6 to the DQ pin. In this situation, whether or not the redundancy is in use cannot be judged based on the results output from the DQ pin. For this reason, whether or not the redundancy is in use is judged by the following method. At the outset, at the time of the roll call test, predetermined data (high data or low data) is previously held in all the memory cells. Upon reading of the data, an expected data is output, from the normal cell 1 not replaced with the redundancy cell 2, to the DQ pin.

Figure 5:
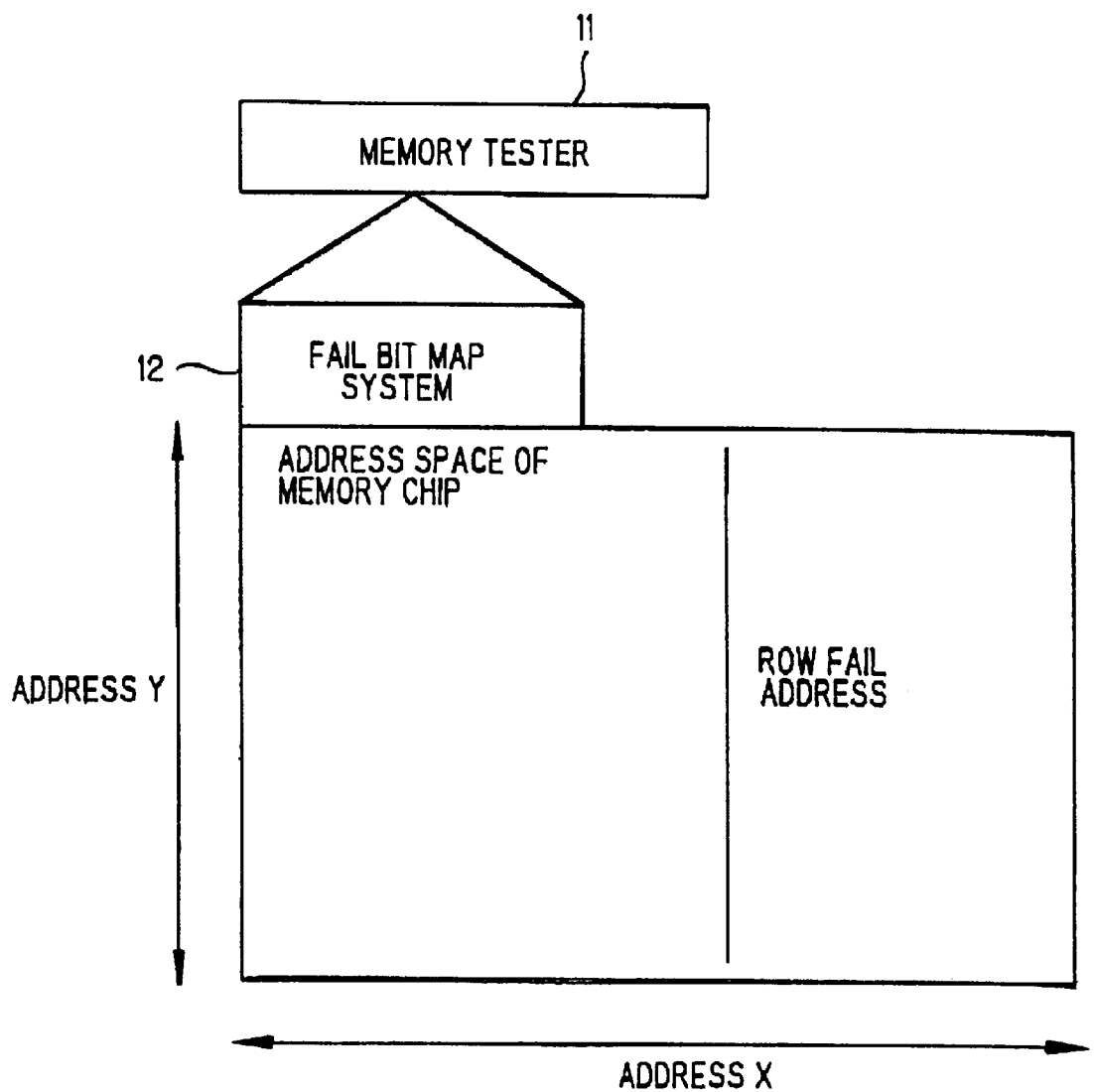
FIG. 5 is a fail bit map diagram showing a method for judging whether redundancy is in use upon malfunction of a data amplifier shown in FIG. 3.
Figure 6:
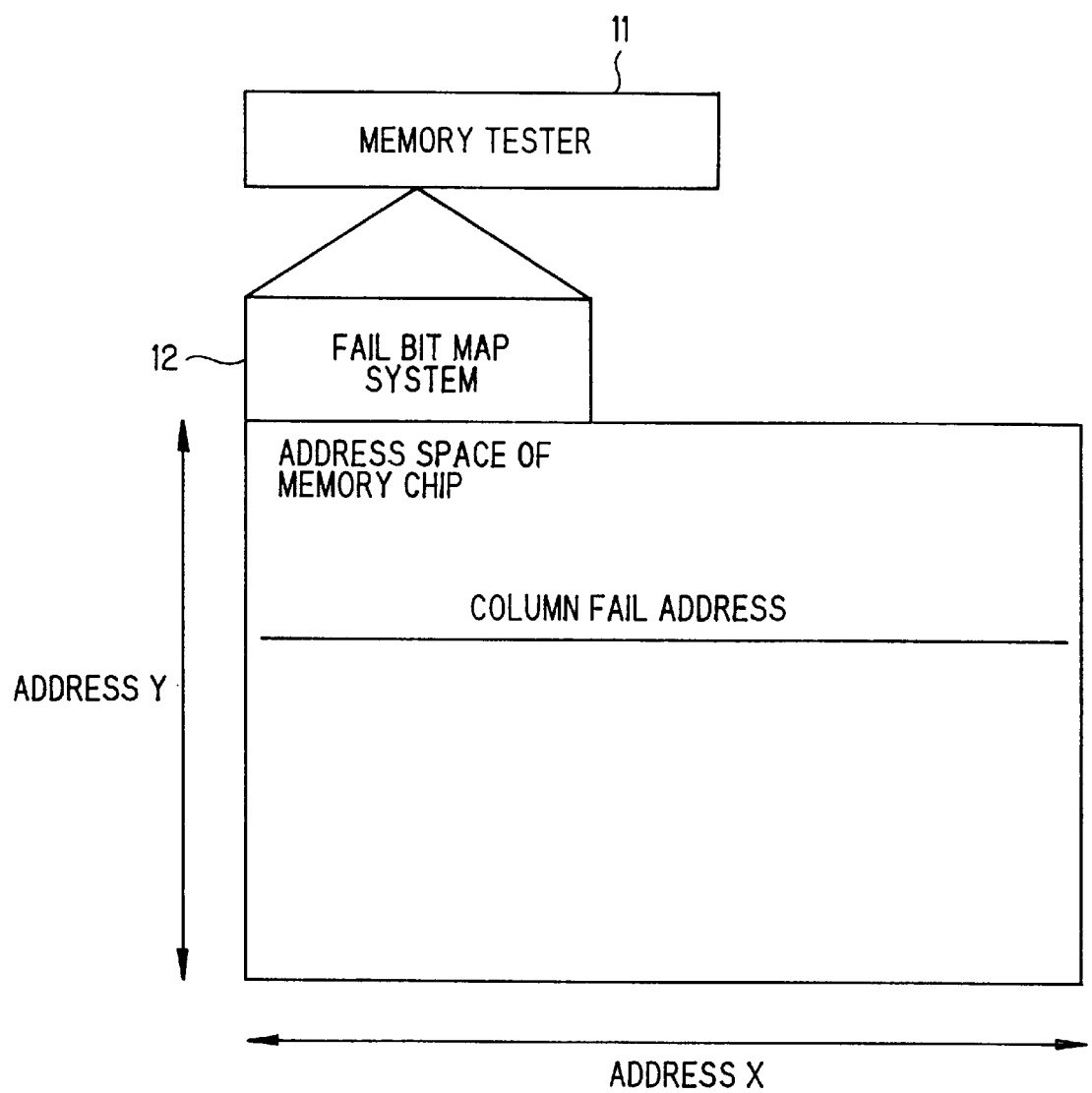
FIG. 6 is another fail bit map diagram showing a method for judging whether redundancy is in use upon malfunction of a data amplifier shown in FIG. 3.

When the normal cell 1 is replaced with the redundancy cell 2, however, there is no forced access to the redundancy cell 2, so that no expected data is output from the redundancy cell 2. This is judged using a memory tester 11 as shown in FIGS. 5 and 6, and use of the redundancy by the failed address memory cell can be confirmed by examining a fail bit map system 12 (a system that analyzes an address space of a memory chip for determining the address of a failed memory cell) of the memory tester 11. FIG. 5 is a fail bit map diagram wherein a predetermined row address is replaced, and FIG. 6 a fail bit map diagram wherein a predetermined column address is replaced.

Thus, in this preferred embodiment of the invention, whether or not the redundancy is in use can be judged as opposed to the prior art technique which requires use of a redundancy detection circuit, for judging whether or not the redundancy is in use, and a signal for judgement results on the use of the redundancy. Further, the chip area can be reduced by virtue of the omission of the redundancy detection circuit and the like.

Figure 7:
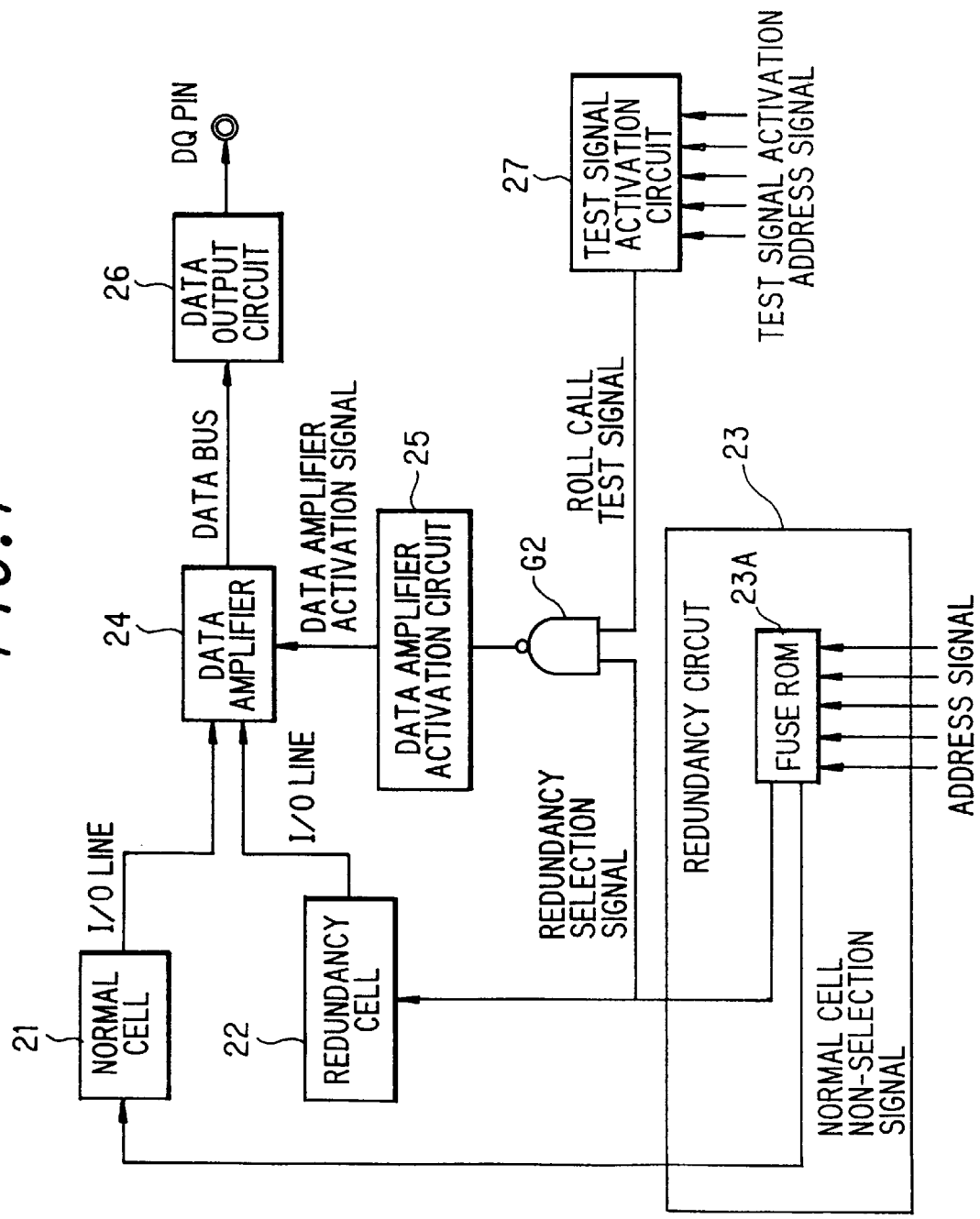
FIG. 7 is a block diagram showing a roll call tester according to another preferred embodiment of the invention.

FIG. 7 shows another preferred embodiment of the invention. A memory cell portion comprises a normal cell 21 and a redundancy cell 22. The normal cell 21 and the redundancy cell 22 each are connected through a bit line or an I/O line to a data amplifier 24 which receives data of the memory cell through the bit line or I/O line, amplifies the data, and output the amplified data to a data bus. The data output circuit 26 receives the data on the data bus, and outputs the data to a DQ pin. A data amplifier activation circuit 25 is provided with an NAND gate G2 as a second logic gate that operates upon receipt of a roll call test signal from a test signal activation circuit 27 and a redundancy selection signal from the redundancy circuit 23. The output of the NAND gate G2 is input into the data amplifier activation circuit 25 which outputs a data amplifier activation signal to the data amplifier 24. A test signal activation address signal is input into the test signal activation circuit 27.

The redundancy circuit 23 comprises FUSEROM 23A. A predetermined address signal is input into FUSEROM 23A. The redundancy circuit 23 outputs a redundancy selection signal and a normal cell non-selection signal. The former is input into the redundancy cell 22 and the data amplifier activation circuit 25, while the latter is input into the normal cell 21. Here the logic gate GI in the redundancy circuit 3 shown in FIG. 3 is removed. The redundancy selection signal is directly output, and is input into the redundancy cell 22 and the data amplifier activation circuit 25. Further, the roll call test signal from the test signal activation circuit 27 is input through the NAND gate G2 into the data amplifier activation circuit 25.

Figure 8:
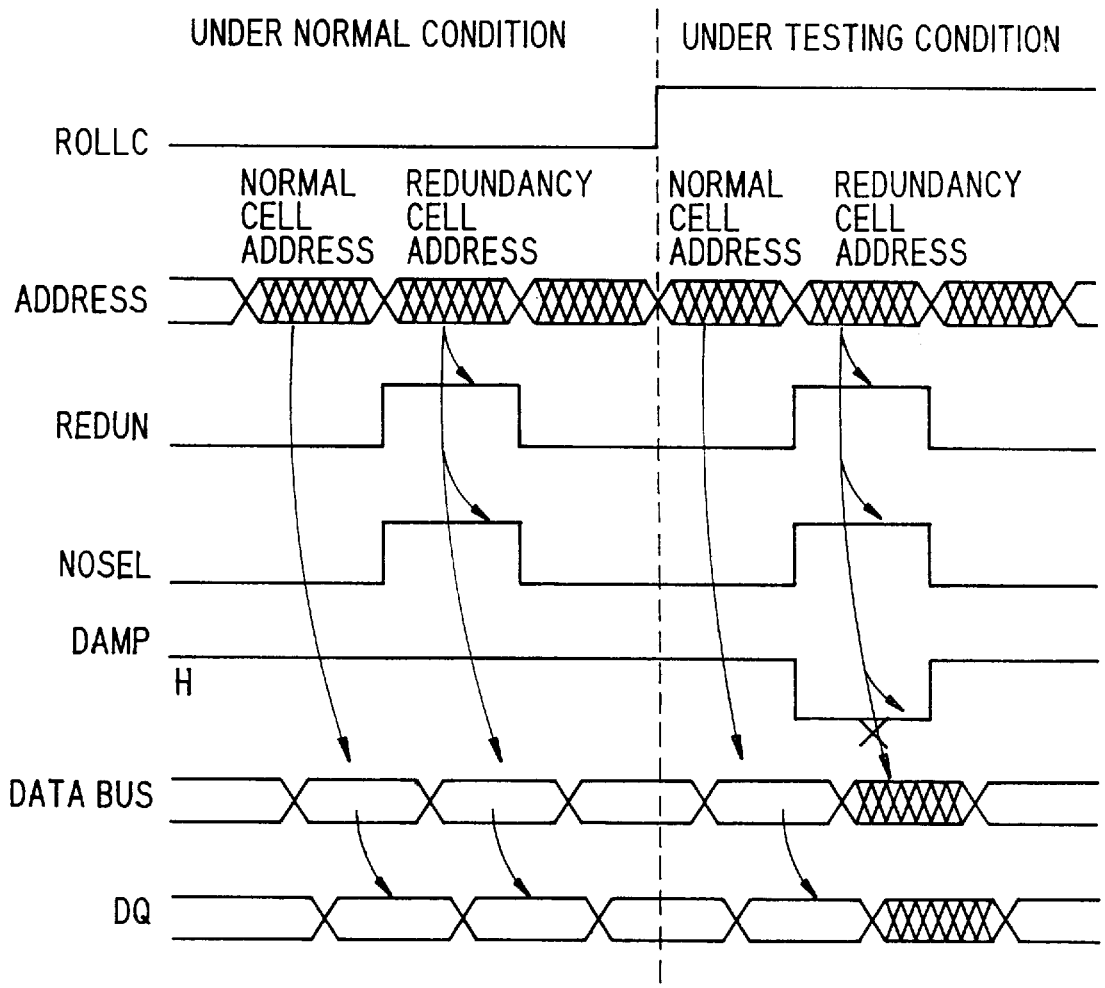
FIG. 8 is a timing chart showing data in each block shown in FIG. 7.

Next, the operation of this preferred embodiment of the invention will be explained with reference to a timing chart shown in FIG. 8. Under normal condition other than the roll call test, as described above, the roll call test signal ROLLC is nonactive. In this case, the NAND gate G2 of the data amplifier activation circuit 25 contains a redundancy selection signal and a roll call test signal. Since the roll call test signal is nonactive, even though the redundancy selection signal is activated, the output of the NAND gate G2 is on "high level," so that the data amplifier activation circuit 25 is activated. For this reason, the data amplifier activation signal DAMP as an output signal from the data amplifier activation circuit 25 is active. Upon predetermined addressing, data from the normal cell 21 and the redundancy cell 22 is output through the I/O line, the data amplifier 24, the data bus, and the data output circuit 26 to the DQ pin.

On the other hand, at the time of the roll call test, the roll call test signal ROLLC is activated, and is input into the NAND gate G2 of the data amplifier activation circuit 25. When the redundancy circuit 23 is nonactive as a result of predetermined addressing, the redundancy selection signal REDUN and the normal cell non-selection signal NOSEL are nonactive. Therefore, the output of the NAND gate G2 of the data amplifier activation circuit 25, into which the redundancy selection signal is input, is on "high level," so that the data amplifier activation circuit 25 is activated to activate the data amplifier activation signal. This permits the data from the normal cell 21 to be output through the I/O line, the data amplifier 24, the data bus, and the data output circuit 26 to the DQ pin.

Activation of the redundancy circuit 23 by predetermined addressing results in activation of the redundancy selection signal REDUN and the normal cell non-selection signal NOSEL. The activated redundancy selection signal is input into the NAND gate G2. In this case, since the input test signal also is active, the output of the NAND gate G2 is on "low level," so that the data amplification activation circuit 25 is rendered nonactive, and the data amplifier activation signal DAMP is rendered nonactive. This permits the data amplifier 24 to be rendered nonactive. Further, since the redundancy selection signal REDUN and the normal cell non-selection signal NOSEL are active, the data of the redundancy cell 22 is transmitted through the I/O line to the data amplifier 24, while since the data amplifier 24 is nonactive, any data is not output from the data amplifier 24 to the data bus. As a result, the data output circuit 26 also outputs no established data to the DQ pin. Whether or not the redundancy is in use can be confirmed using the fail bit map system in the memory tester 11 shown in FIGS. 5 and 6.

According to this preferred embodiment, at the time of the roll call test, upon activation of the redundancy circuit 23, the redundancy selection signal is activated, and data from the redundancy cell 22 can be transmitted to the I/O line. However, the data amplifier activation circuit 25 is rendered nonactive by the redundancy selection signal and the test signal input into the data amplifier activation circuit 25, thereby rendering the data amplifier 24 nonactive. Therefore, no data is output from the data amplifier 24 to the data bus. Thus, this preferred embodiment is characterized in that access to the memory cell portion is made independently of whether or not the redundancy is selected, and the output of the data from the redundancy cell 22 is inhibited in a later stage. Further, under the roll call testing condition and under the redundancy selected condition, since the data amplifier activation circuit 25 and the data amplifier 24 are nonactive, current necessary for these circuits can be advantageously reduced.

As is apparent from the foregoing description, according to the invention, in a roll call tester, the redundancy circuit is constructed so that, when the roll call test signal in the test signal activation circuit is nonactive, the redundancy circuit, upon predetermined normal cell addressing, activates the normal cell while rendering the redundancy cell nonactive, and, upon predetermined redundancy cell addressing, renders the normal cell nonactive while activating the redundancy cell, while when the roll call test signal in the test signal activation circuit is active, the redundancy circuit, upon predetermined normal cell addressing, activates the normal cell while rendering the redundancy cell nonactive, and, upon predetermined redundancy cell addressing, renders both the normal cell nonactive and the redundancy cell nonactive. By virtue of this construction, a redundancy detection circuit and a signal involved in the detection are unnecessary, and the addition, to the redundancy circuit, of logic for rendering the redundancy selection signal nonselective by a roll call test signal even when the redundancy circuit is active can realize a roll call test. Further, the chip area can be reduced. Therefore, a reduction in size of the roll call tester and a reduction in cost can be advantageously realized.

The invention has been described in detail with particular reference to preferred embodiments, but it will be understood that variations and modifications can be effected within the scope of the invention as set forth in the appended claims.

What is claimed is:

1. A roll call tester comprising:
   a data amplifier which amplifies data of a normal cell or a redundancy cell upon activation of the normal cell or the redundancy cell, and outputs the amplified data to a data output circuit;
   a data amplifier activation circuit which outputs a data amplifier activation signal to the data amplifier independently of whether or not a roll call test is in operation;
   a test signal activation circuit which outputs an active roll call test signal at the time of the roll call test; and
   a redundancy circuit which:
   when the roll call test signal from the test signal activation circuit is nonactive and when predetermined normal cell addressing is provided, the normal cell is activated while the redundancy cell is rendered nonactive, and, when predetermined redundancy cell addressing is provided, the normal cell is rendered nonactive while the redundancy cell is activated, and,
   when the roll call test signal from the test signal activation circuit is active, and when predetermined normal cell addressing is provided, the normal cell is activated while the redundancy cell is rendered nonactive, and, when predetermined redundancy cell addressing is provided, both the normal cell and the redundancy cell are rendered nonactive.

2. The roll call tester according to claim 1, wherein said redundancy circuit comprises a logic gate which receives at a first input a predetermined redundancy cell address signal and at a second input a nonactive roll call test signal from the test signal activation circuit, and outputs a redundancy selection signal.

3. A roll call testers comprising:
   a data amplifier for amplifying, upon activation of a normal cell or a redundancey cell, data of the normal cell or the redundancy cell and outputting the amplified data to a data output circuit;
   a test signal activation circuit for outputting an active roll call test signal at the time of the roll call test;
   a logic gate which, when the roll call test signal of the test signal activation circuit is nonactive, activates the data amplifier through a data amplifier activation circuit; and
   a redundancy circuit which:
   when the roll call test signal from the test signal activation circuit is nonactive, activates the data amplifier through the logic gate and, when predetermined normal cell addressing is provided, the normal cell is activated while the redundancy cell is rendered nonactive, and, when predetermined redundancy cell addressing is provided, the normal cell is rendered nonactive while the redundancy cell is activated, and,
   when the roll call test signal from the test signal activation circuit is active, and when predetermined normal cell addressing is provided, the normal cell is activated while the redundancy cell is rendered nonactive, and activates the data amplifier through the logic gate, and, when predetermined redundancy cell addressing is provided, both the normal cell and the redundancy cell are rendered nonactive and the data amplifier is rendered nonactive through the logic gate.

4. The roll call tester according to claim 3, wherein the logic gate is a NAND gate.

5. The roll call tester according to claim 1, wherein, upon malfunction of the data amplifier, a determination of whether or not the redundancy is in use is judged using data that is previously held in the normal cell and the redundancy cell, wherein a memory tester is used to determine whether, upon reading the data, an expected value is output from the normal cell because it is not replaced with the redundancy cell data, while an expected value is not output from the redundancy cell.

6. The roll call tester according to claim 5, wherein the data that is previously held in said normal cell and said redundancy cell is predetermined at the time of the roll call test.

7. The roll call tester according to claim 3, wherein upon malfunction of the data amplifier, a determination of whether or not the redundancy is in use is judged using data that is previously held in the normal cell and the redundancy cell, wherein a memory tester is used to determine whether, upon reading the data, an expected value is output from the normal cell because it is not replaced with the redundancy cell data, while an expected value is not output from the redundancy cell.

8. The roll call tester according to claim 7, wherein the data that is previously held in said normal cell and said redundancy cell is predetermined at the time of the roll call test.

* * * * *